(12) United States Patent
Gonzalez

(10) Patent No.: US 7,602,001 B2
(45) Date of Patent: Oct. 13, 2009

(54) CAPACITORLESS ONE TRANSISTOR DRAM CELL, INTEGRATED CIRCUITRY COMPRISING AN ARRAY OF CAPACITORLESS ONE TRANSISTOR DRAM CELLS, AND METHOD OF FORMING LINES OF CAPACITORLESS ONE TRANSISTOR DRAM CELLS

(75) Inventor: Fernando Gonzalez, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 37 days.

(21) Appl. No.: 11/488,384

(22) Filed: Jul. 17, 2006

(65) Prior Publication Data

US 2008/0012056 A1 Jan. 17, 2008

(51) Int. Cl.
*H01L 27/108* (2006.01)
*H01L 21/3205* (2006.01)

(52) U.S. Cl. ............... 257/296; 257/347; 257/E27.084; 257/E21.409; 438/149; 438/596

(58) Field of Classification Search ................ 257/213, 257/288, 296, 347, 348, 349, 350, E21.001, 257/E21.002, E21.04, E21.085, E21.394, 257/E21.4, E21.409, E21.421, E27.001, E27.009, 257/E27.01, E21.07, E27.081, E27.084, E27.085; 438/142, 149, 151, 584, 585, 595, 596
See application file for complete search history.

(56) References Cited

U.S. PATENT DOCUMENTS

| 5,358,879 A | 10/1994 | Brady et al. | |
|---|---|---|---|
| 5,446,299 A * | 8/1995 | Acovic et al. | 257/316 |
| 5,693,549 A * | 12/1997 | Kim | 438/157 |
| 5,714,786 A | 2/1998 | Gonzalez et al. | |
| 5,753,947 A | 5/1998 | Gonzalez | |
| 6,005,273 A | 12/1999 | Gonzalez et al. | |
| 6,090,693 A | 7/2000 | Gonzalez et al. | |

(Continued)

FOREIGN PATENT DOCUMENTS

WO    WO 2007/014689    6/2007

(Continued)

OTHER PUBLICATIONS

J. Chen et al., *The Enhancement of Gate-Induced-Drain-Leakage (GIDL) Current in Short-Channel SOI MOSFET and its Application in . . .* , IEEE Electron Device Letters, vol. 13, No. 11, pp. 572-574 (Nov. 1992).

(Continued)

*Primary Examiner*—Evan Pert
*Assistant Examiner*—Kevin Quinto
(74) *Attorney, Agent, or Firm*—Wells St. John P.S.

(57) ABSTRACT

This invention includes a capacitorless one transistor DRAM cell that includes a pair of spaced source/drain regions received within semiconductive material. An electrically floating body region is disposed between the source/drain regions within the semiconductive material. A first gate spaced is apart from and capacitively coupled to the body region between the source/drain regions. A pair of opposing conductively interconnected second gates are spaced from and received laterally outward of the first gate. The second gates are spaced from and capacitively coupled to the body region laterally outward of the first gate and between the pair of source/drain regions. Methods of forming lines of capacitorless one transistor DRAM cells are disclosed.

38 Claims, 12 Drawing Sheets

U.S. PATENT DOCUMENTS

| | | | |
|---|---|---|---|
| 6,096,596 | A | 8/2000 | Gonzalez |
| 6,420,786 | B1 | 7/2002 | Gonzalez et al. |
| 6,632,723 | B2 | 10/2003 | Watanabe et al. |
| 6,818,937 | B2 | 11/2004 | Noble et al. |
| 6,888,198 | B1 | 5/2005 | Krivokapic |
| 6,888,770 | B2 | 5/2005 | Ikehashi |
| 6,969,662 | B2 | 11/2005 | Fazan et al. |
| 7,005,710 | B1 | 2/2006 | Gonzalez et al. |
| 7,027,334 | B2 | 4/2006 | Ikehashi |
| 7,030,436 | B2 | 4/2006 | Forbes |
| 2002/0130378 | A1 | 9/2002 | Forbes et al. |
| 2002/0192911 | A1 | 12/2002 | Parke |
| 2003/0094651 | A1 | 5/2003 | Suh |
| 2004/0061148 | A1 | 4/2004 | Hsu |
| 2004/0197995 | A1* | 10/2004 | Lee et al. .................... 438/257 |
| 2005/0017240 | A1 | 1/2005 | Fazan |
| 2005/0063224 | A1 | 3/2005 | Fazan et al. |
| 2005/0124130 | A1 | 6/2005 | Mathew et al. |
| 2005/0167751 | A1 | 8/2005 | Nakajima et al. |
| 2006/0083058 | A1 | 4/2006 | Ohsawa |
| 2006/0194410 | A1 | 8/2006 | Sugaya |
| 2007/0001222 | A1* | 1/2007 | Orlowski et al. ............ 257/347 |
| 2007/0158719 | A1 | 7/2007 | Wang |
| 2008/0061346 | A1 | 3/2008 | Tang et al. |

FOREIGN PATENT DOCUMENTS

WO PCT/US2007/019592 2/2008

OTHER PUBLICATIONS

Y. Choi et al., *Investigation of Gate-Induced Drain Leakage (GIDL) Current in Thin Body Devices: Single-Gate Ultra-Thin Body, Symmetrical Double-Gate, and . . .* , Jpn. J. Appl. Phys., vol. 42, pp. 2073-2076 (2003).

F. Gonzalez et al., *A dynamic source-drain extension MOSFET using a separately biased conductive spacer*, Solid-State Electronics, vol. 46, pp. 1525-1530 (2002).

C. Kuo et al., *A Capacitorless Double-Gate DRAM Cell Design for High Density Applications*, IEEE, IEDM, pp. 843-846 (2002).

E. Lusky et al., *Investigation of Channel Hot Electron Injection by Localized Charge-Trapping Nonvolatile Memory Devices*, IEEE Transactions on Electron Devices, vol. 51, No. 3, pp. 444-451 (Mar. 2004).

M. Minami et al., *A High Speed and High Reliability MOSFET Utilizing an Auxiliary Gate*, 1990 Symposium on VLSI Technology, IEEE, pp. 41-42 (1990).

K. Sunouchi et al., *Double LDD Concave (DLC) Structure for Sub-Half Micron MOSFET*, IEEE, IEDM, pp. 226-228 (1988).

S. Tiwari et al., *Straddle Gate Transistors: High $I_{on}/I_{off}$ Transistors at Short Gate Lengths*, IBM Research Article, pp. 26-27 (pre-Mar. 2006).

E. Yoshida et al., *A Capacitorless 1T-DRAM Technology Using Gate-Induced Drain-Leakage (GIDL) Current for Low-Power and High-Speed . . .* , IEEE Transactions on Electron Devices, vol. 53, No. 4, pp. 692-697 (Apr. 2006).

Invitation fo Pay Additional Fees, date of mailing Jan. 14, 2008, including documents considered to be relevant, pp. 1-10.

Fazan et al., "MOSFET design simplifies DRAM", EE Times, May 13, 2002, 7 pgs.

Hara, "Toshiba cuts capacitor from DRAM cell design", EE Times, http://www.us.design-reuse.com/news/news24,html, Feb. 7, 2002, 2 pgs.

Minami et al., "A Floating Body Cell (FBC) Fully Compatible with 90 nm CMOS Technology (CMOS4) for 128Mb SOI DRAM", 2005 IEDM Technical Program, 2005, pp. 13.1.1-13.1.4.

Ranica et al., "A One Transistor Cell on Bulk Substrate (1T-Bulk) for Low-Cost & High Density eDRAM", VLSI Technology, 2004, IEEE, (Jun. 15, 2004), pp. 128-129.

Tanaka et al., "Scalability study on a capacitorless 1T-DRAM: from single-gate PD-SOI to double-gate FinDRAM", IEDM Technical Digest, IEEE International Electron Devices Meeting, Dec. 13-15, 2004, pp. 37.5-1.37-5.4.

Villaret et al., "Mechanisms of charge modulation in the floating body of triple-well nMOSFET capacitor-less DRAMs", vol. 72 (1-4), Elsevier Publishers B.V., Apr. 2004, pp. 434-439.

Yoshida et al., "A design of a capacitorless 1T-DRAM cell using gate-induced drain leakage (GIDL) current for low-power and high-speed embedded memory", IEEE International Electron Devices Meeting, 2003, IEDM '03 Technical Digest, Dec. 8-10, 2003, pp. 37.6.1-37.6.4.

* cited by examiner

CAPACITORLESS ONE TRANSISTOR DRAM CELL, INTEGRATED CIRCUITRY COMPRISING AN ARRAY OF CAPACITORLESS ONE TRANSISTOR DRAM CELLS, AND METHOD OF FORMING LINES OF CAPACITORLESS ONE TRANSISTOR DRAM CELLS

TECHNICAL FIELD

This invention relates to capacitorless one transistor DRAM cells, to integrated circuitry comprising an array of capacitorless one transistor DRAM cells, and the methods of forming lines of capacitorless one transistor DRAM cells.

BACKGROUND OF THE INVENTION

Semiconductor memories, such as dynamic random access memory (DRAMs), are widely used in computer systems for storing data. A DRAM cell typically includes an access field effect transistor (FET) and a storage capacitor. The access FET allows the transfer of data charges to and from the storage capacitor during reading and writing operations. Data charges on the storage capacitor are periodically refreshed during a refresh operation.

Capacitorless one transistor DRAM cells have also been developed. One type of such cell utilizes a floating body effect of a semiconductor-on-insulator transistor, for example as disclosed in U.S. Pat. No. 6,969,662. Such memory cell might comprise a partially depleted or a fully depleted silicon-on-insulator transistor (or transistor formed in bulk substrate material) having a channel which is disposed adjacent to the body and separated therefrom by a gate dielectric. The body region of the transistor is electrically floating in view of insulation or a non-conductive region disposed beneath the body region. The state of the memory cell is determined by the concentration of charge within the body region of the semiconductor-on-insulator transistor.

While the invention was motivated in addressing the above identified issues, it is in no way so limited. The invention is only limited by the accompanying claims as literally worded, without interpretive or other limiting reference to the specification, and in accordance with the doctrine of equivalents.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The discussion proceeds initially with exemplary methods of forming a line of capacitorless one transistor DRAM cells. Aspects of the invention also include capacitorless one transistor DRAM cells, and integrated circuitry comprising an array of capacitorless one transistor DRAM cells, independent of the method of manufacture.

Figure 1:
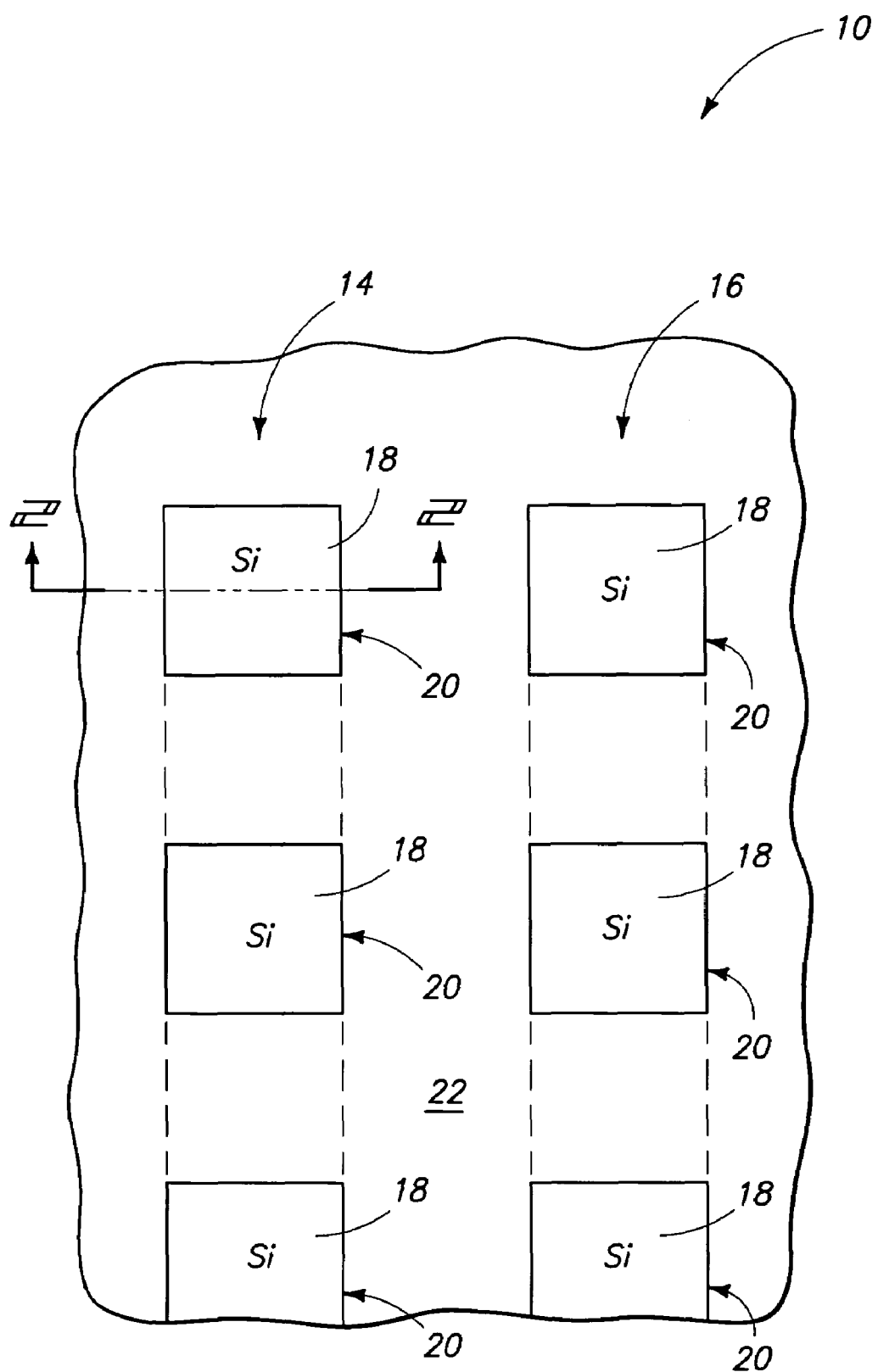
FIG. 1 is a diagrammatic top plan view of a semiconductor substrate in process in accordance with an aspect of the invention.
Figure 2:
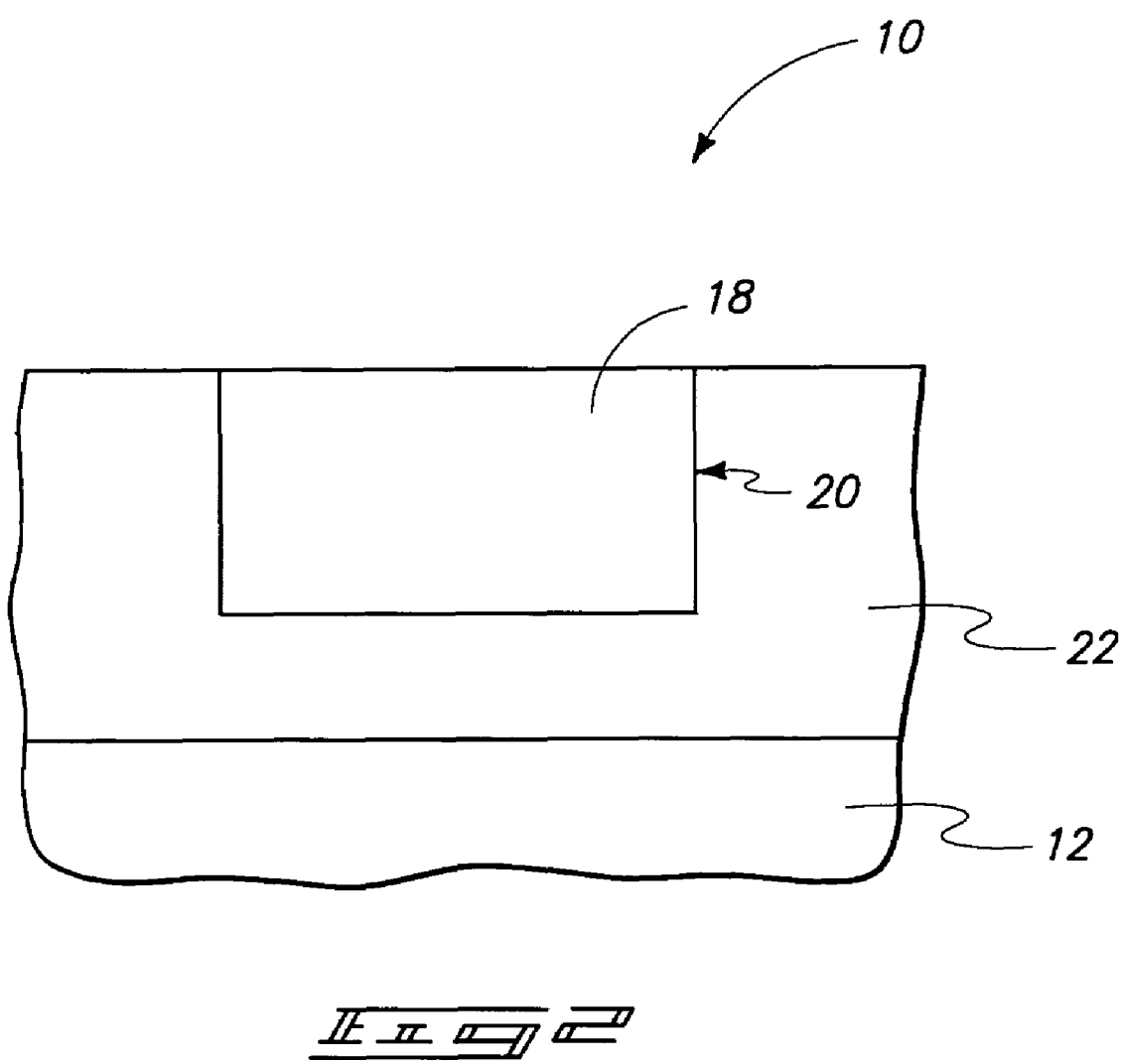
FIG. 2 is a diagrammatic section view taken through line 2-2 in FIG. 1.

Referring to FIGS. 1 and 2, a substrate (preferably a semiconductor substrate) is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 10 comprises a base substrate 12, for example bulk monocrystalline silicon. However, substrate 10 might comprise another substrate, whether existing or yet-to-be developed, and for example comprise a semiconductor-on-insulator substrate.

Substrate 10 is formed to comprise exemplary lines 14, 16 of spaced islands 20 of semiconductive material 18. Lines 14, 16 are shown as being essentially straight linear, although curved, jagged, angled or other shaped lines are of course contemplated. An exemplary preferred semiconductive material 18 is monocrystalline silicon, for example fabricated of exemplary bulk semiconductor substrate material 12. By way of example only, an exemplary manner of forming depicted islands 20 is by existing or yet-to-be developed trench and refill techniques of forming insulative material 22 laterally about islands 20. An exemplary preferred material includes one or a combination of silicon dioxide and/or silicon nitride. Insulative material 22 elevationally beneath islands 20 can be fabricated, for example, by ion implanting oxygen atoms into bulk substrate material 12 to a peak implant depth immediately beneath islands 20, and forming silicon dioxide therefrom. Alternately by way of example only and although less preferred, insulative material 22 might be deposited, island openings 20 etched therein, and which are subsequently filled with a semiconductive material, for example monocrystalline and/or polycrystalline silicon. Further alternately, of course, one or more techniques could be utilized whereby laterally opposing trenches are made into semiconductor substrate 12, followed by laterally undercut etching beneath islands 20, and wherein the undercut volume is subsequently filled with one or more insulative materials. Regardless, in one exemplary implementation insulative material 22 can be considered as received laterally about and beneath respective islands 20, and contacting semiconductive material 18 of such islands. The discussion proceeds for ease of description relative to a method of forming a line of capacitorless one transistor DRAM cells relative to line 14 of spaced islands 20 of semiconductive material 18.

Figure 3:
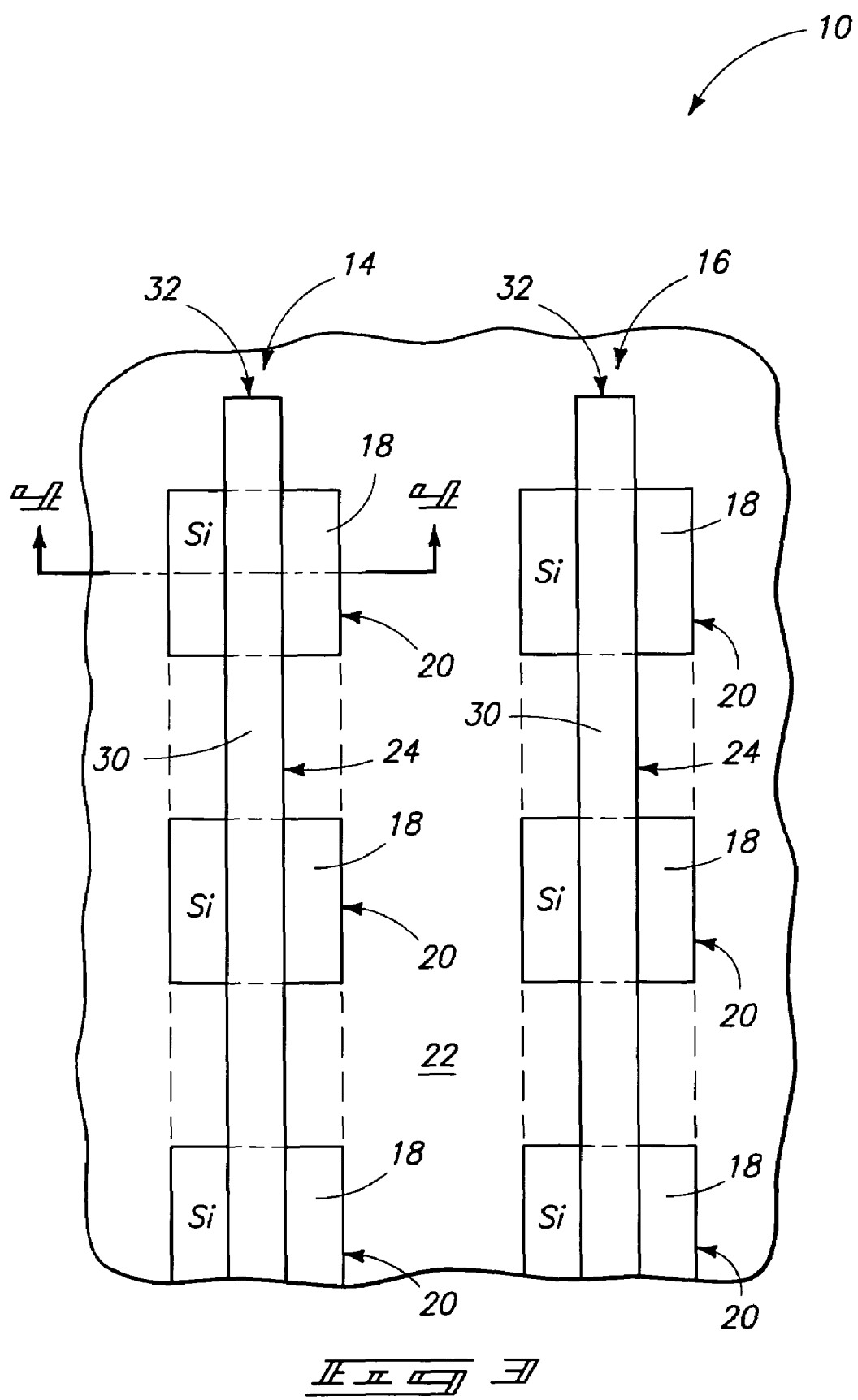
FIG. 3 is a view of the FIG. 1 substrate at a processing step subsequent to that shown by FIG. 1.
Figure 4:
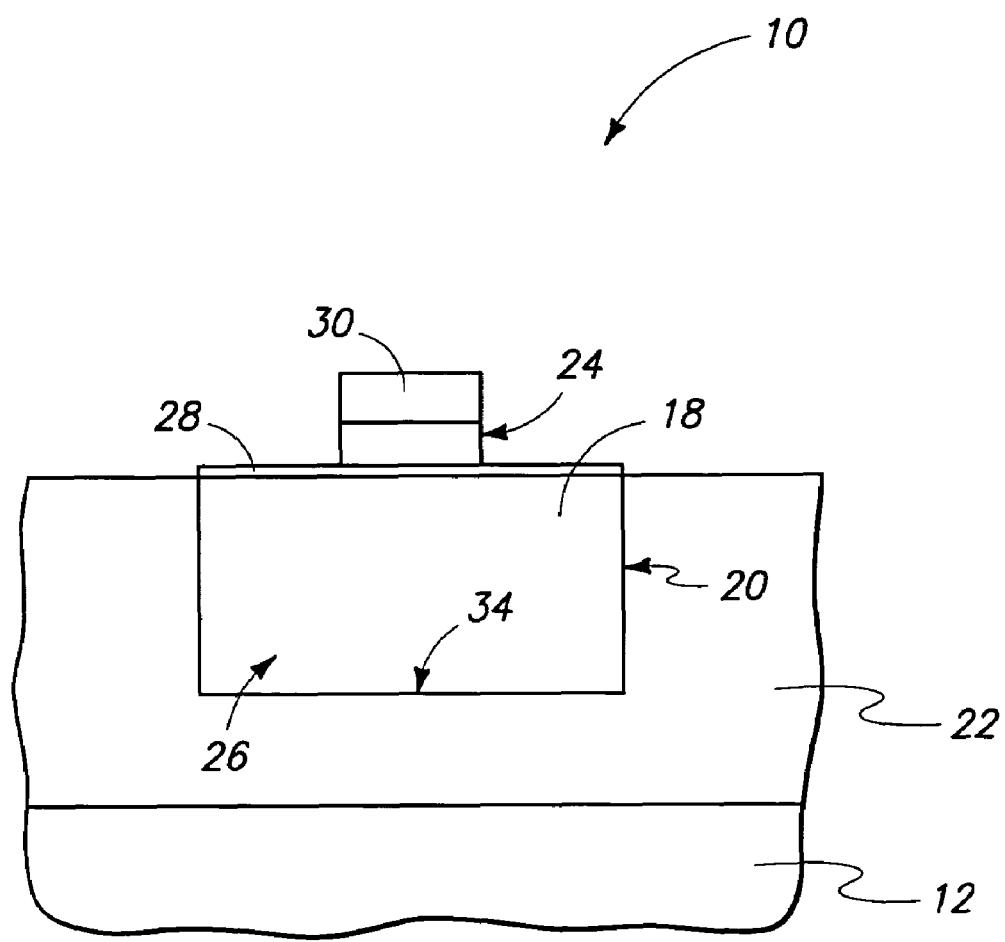
FIG. 4 is a diagrammatic section view taken through line 4-4 in FIG. 3.

Referring to FIGS. 3 and 4, a word line 24 is formed, which is common to and extends over line 14 of spaced islands 20. Word line 24 is formed over a floating body region 26 of the respective spaced islands 20. Word line 24 is spaced apart from and capacitively coupled to body region 26, for example by/through exemplary depicted dielectric layer 28. Such might comprise any suitable dielectric, with silicon dioxide thermally grown from preferred silicon semiconductive material 18 being but one example. An exemplary preferred thickness range for material(s) 28 is from 12 Angstroms to 100 Angstroms. Further by way of example only, an exemplary preferred depth for material 18 is from 500 Angstroms to 1,000 Angstroms. Word line 24 preferably comprises any one or combination of refractory metals, refractory metal silicides, and/or conductively doped semiconductive materials such as polycrystalline silicon. An insulative cap 30 is received over word line 24, with silicon nitride and/or silicon dioxide being exemplary materials. For purposes of the continuing discussion, word line 24 can be considered as comprising an end 32 in the exemplary FIG. 3 depiction. For purposes of the continuing discussion, floating body region 26 can be considered as having a base 34, with insulative material 22 being received thereagainst. An exemplary preferred thickness range for insulative material 22 beneath base 34 in but one implementation is from 500 Angstroms to 3,000 Angstroms.

Figure 5:
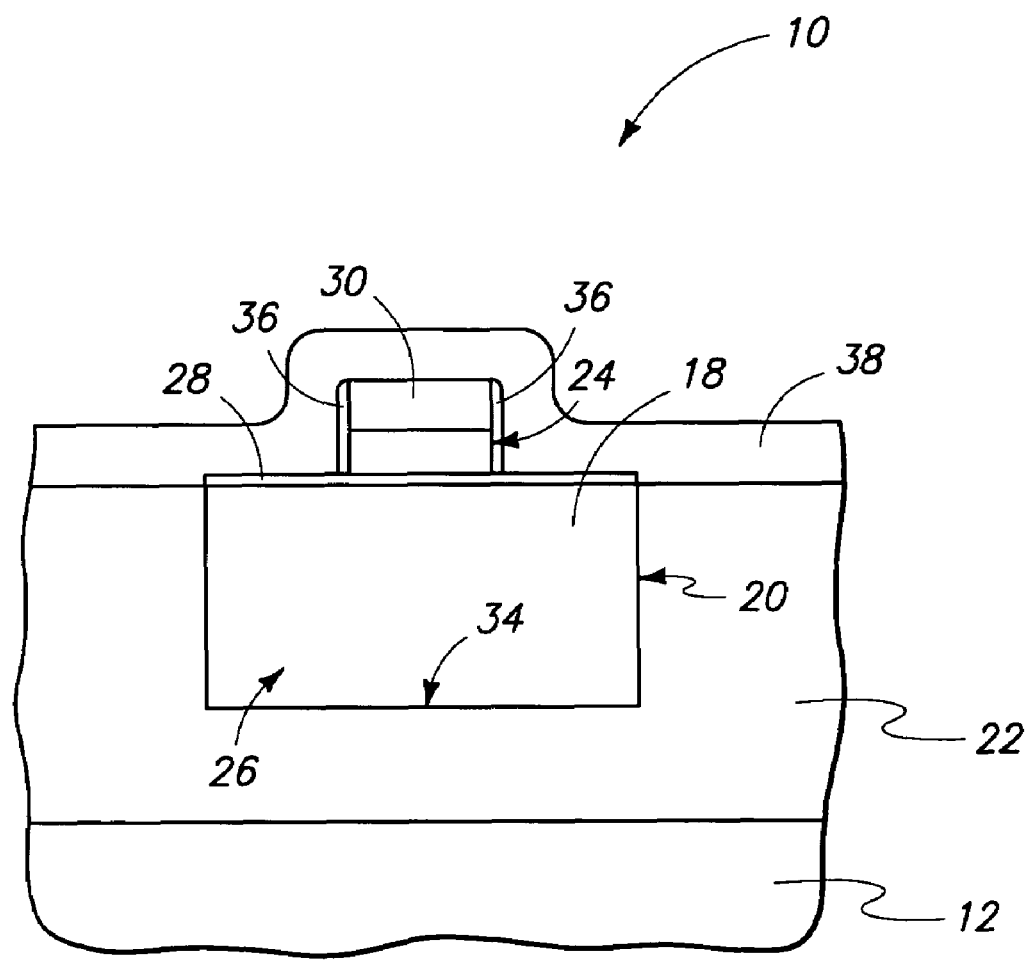
FIG. 5 is a view of the FIG. 4 substrate at a processing step subsequent to that shown by FIG. 4.

Referring to FIG. 5, insulative material 36 is formed over the sidewalls of word lines/gates 24. Such might be comprised of a single material, or one or more materials for example with each of the depicted regions 36 comprising two or more layers of different insulative materials. Exemplary preferred materials include silicon dioxide, silicon nitride, silicon oxynitride, hafnium dioxide, and/or aluminum oxide. An exemplary preferred thickness range for material 36 is from 50 Angstroms to 150 Angstroms. Such might be formed by thermal growth or deposition over the sidewalls of the material of word line 24, as one example. Alternately by way of example only, such might be formed by deposition and a subsequent maskless anisotropic spacer etch.

A conductive layer 38 has been formed over and spaced from word line 24, for example spaced therefrom by insulative/dielectric materials 30 and 36. Exemplary preferred materials for layer 38 include titanium nitride, polysilicon (p-type or n-type), aluminum, and cobalt silicide, with an exemplary preferred thickness range for layer 38 being from 50 Angstroms to 500 Angstroms.

Figure 6:
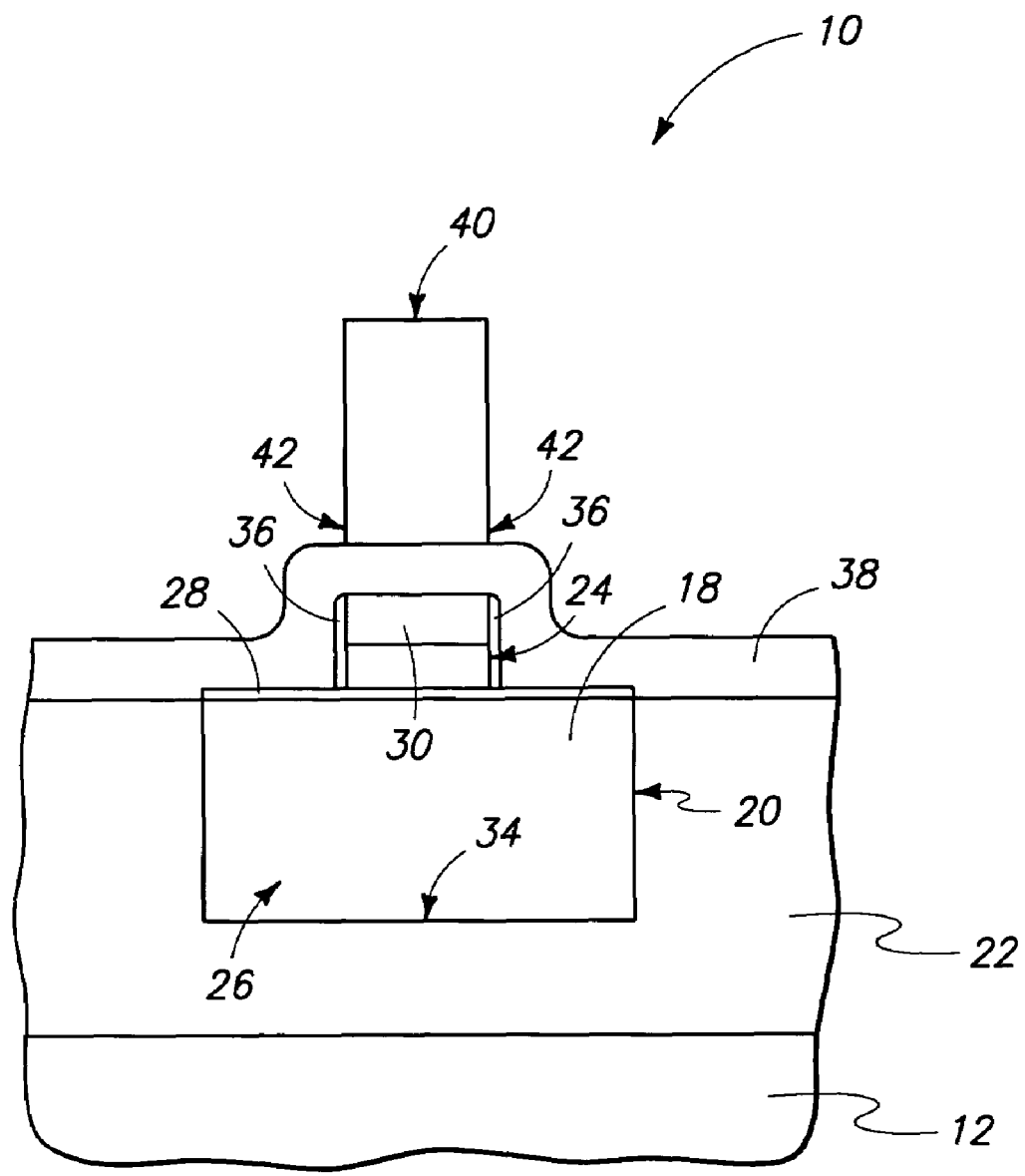
FIG. 6 is a view of the FIG. 5 substrate at a processing step subsequent to that shown by FIG. 5.

Referring to FIG. 6, a masking block 40 has been formed over conductive layer 38 and word line 24. By way of example only, a preferred material for masking block 40 includes photoresist. For purposes of the continuing discussion, masking block 40 can be considered as having spaced opposing lateral edges 42 at least proximate where block 40 is received relative to conductive layer 38.

Figure 7:
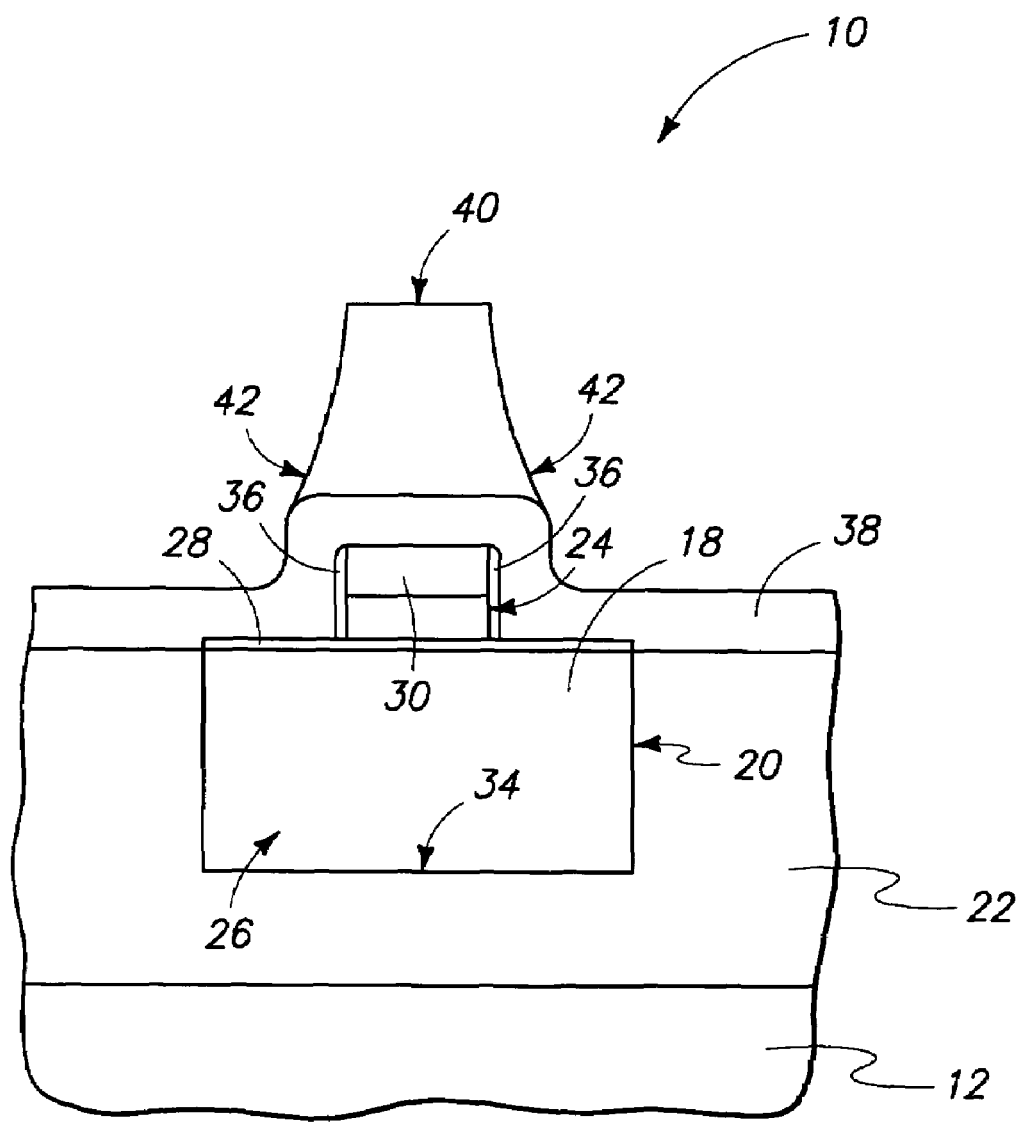
FIG. 7 is a view of the FIG. 6 substrate at a processing step subsequent to that shown by FIG. 6.

Referring to FIG. 7, masking block 40 has been heated effective to move opposing lateral edges 42 laterally outward further away from one another over conductive layer 38. An exemplary technique for doing so includes heating patterned photoresist masking block 40 at 150° C. to from one to three minutes. In the exemplary preferred embodiment, opposing lateral edges 42 are moved laterally outward a distance substantially equal to the lateral thickness of material 38 outwardly of the lateral extent of word line 24 where masking block 40 is patterned initially to substantially coincide with that of the pattern from which word line 24 and insulative capping material 30 thereover are patterned.

Figure 8:
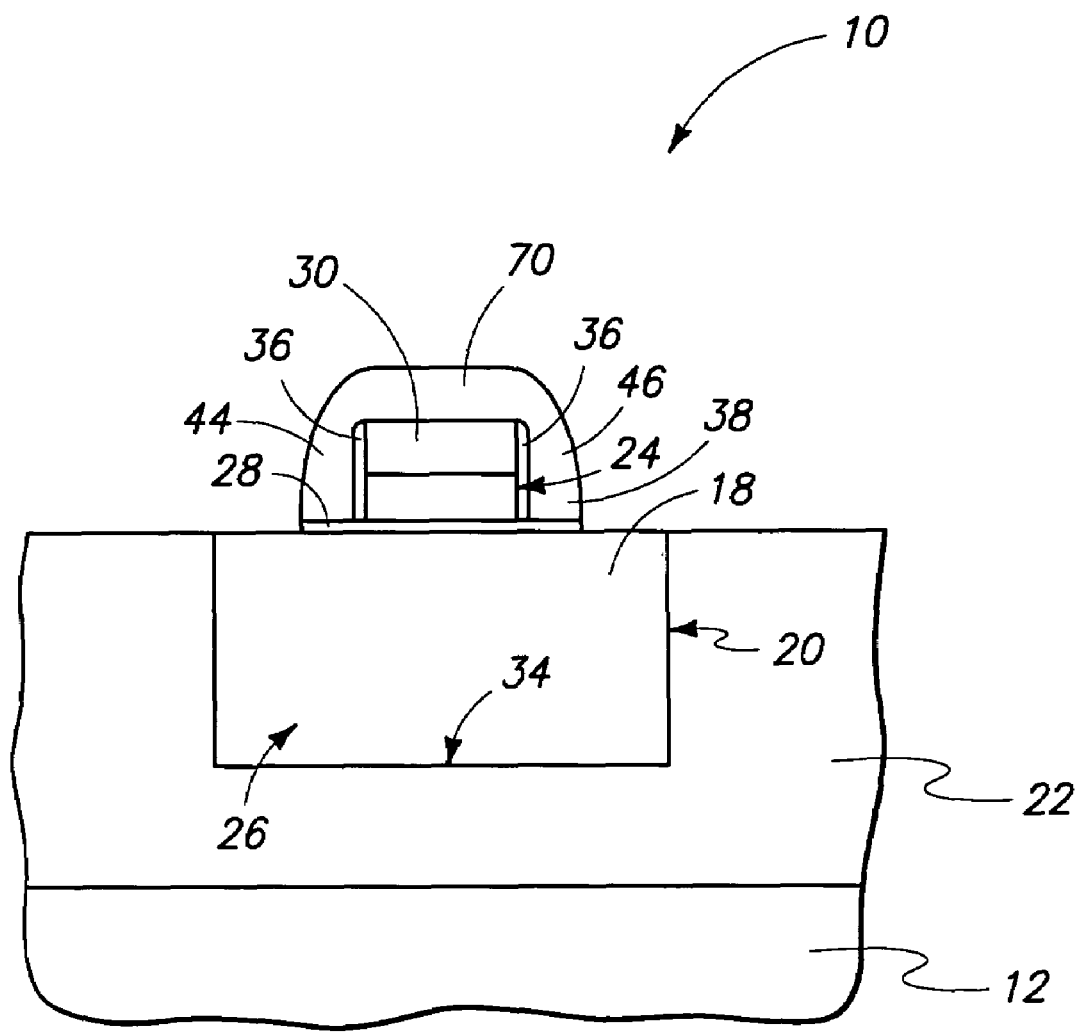
FIG. 8 is a view of the FIG. 7 substrate at a processing step subsequent to that shown by FIG. 7.
Figure 9:
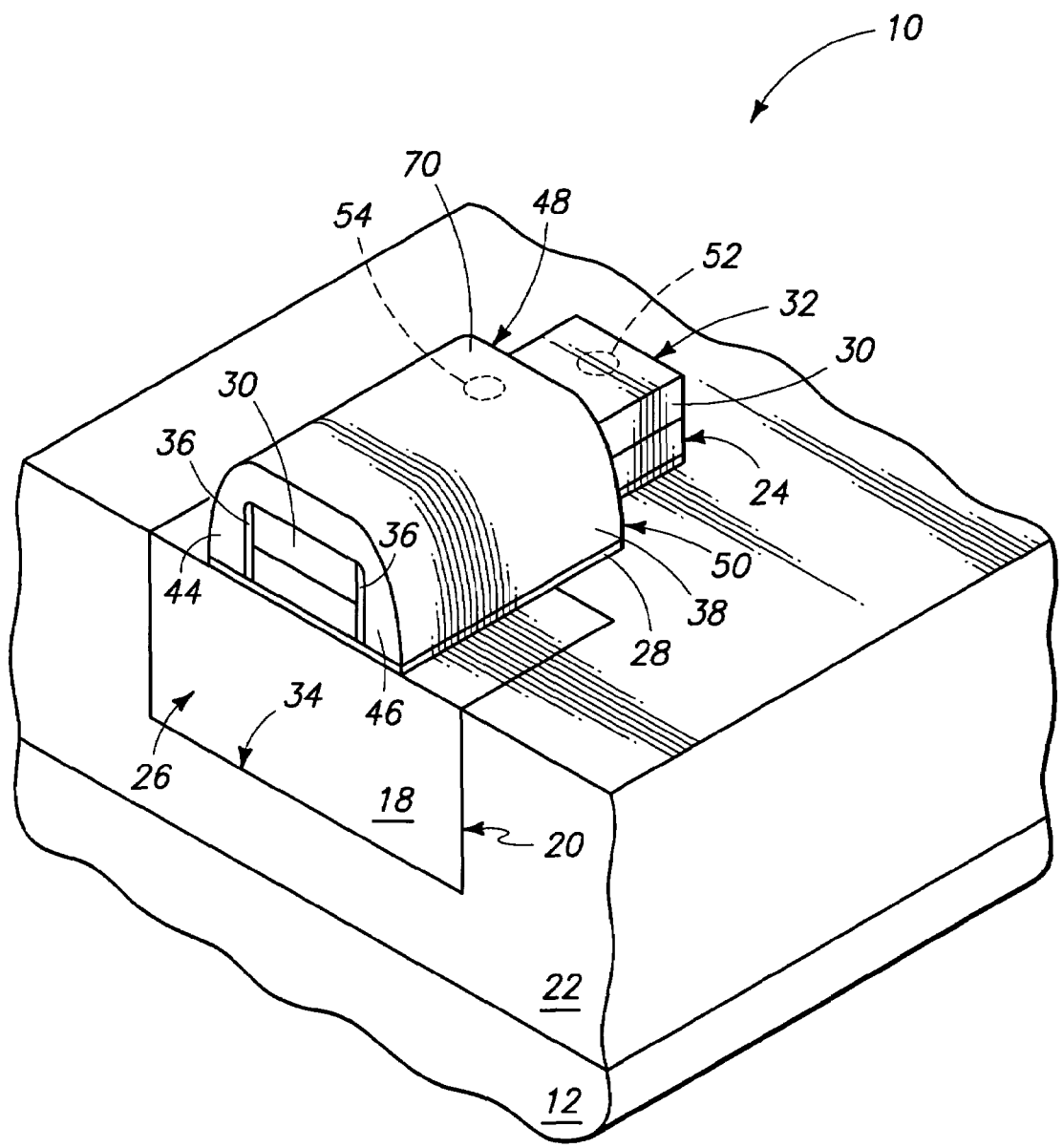
FIG. 9 is a diagrammatic perspective view of the FIG. 8 substrate.
Figure 10:
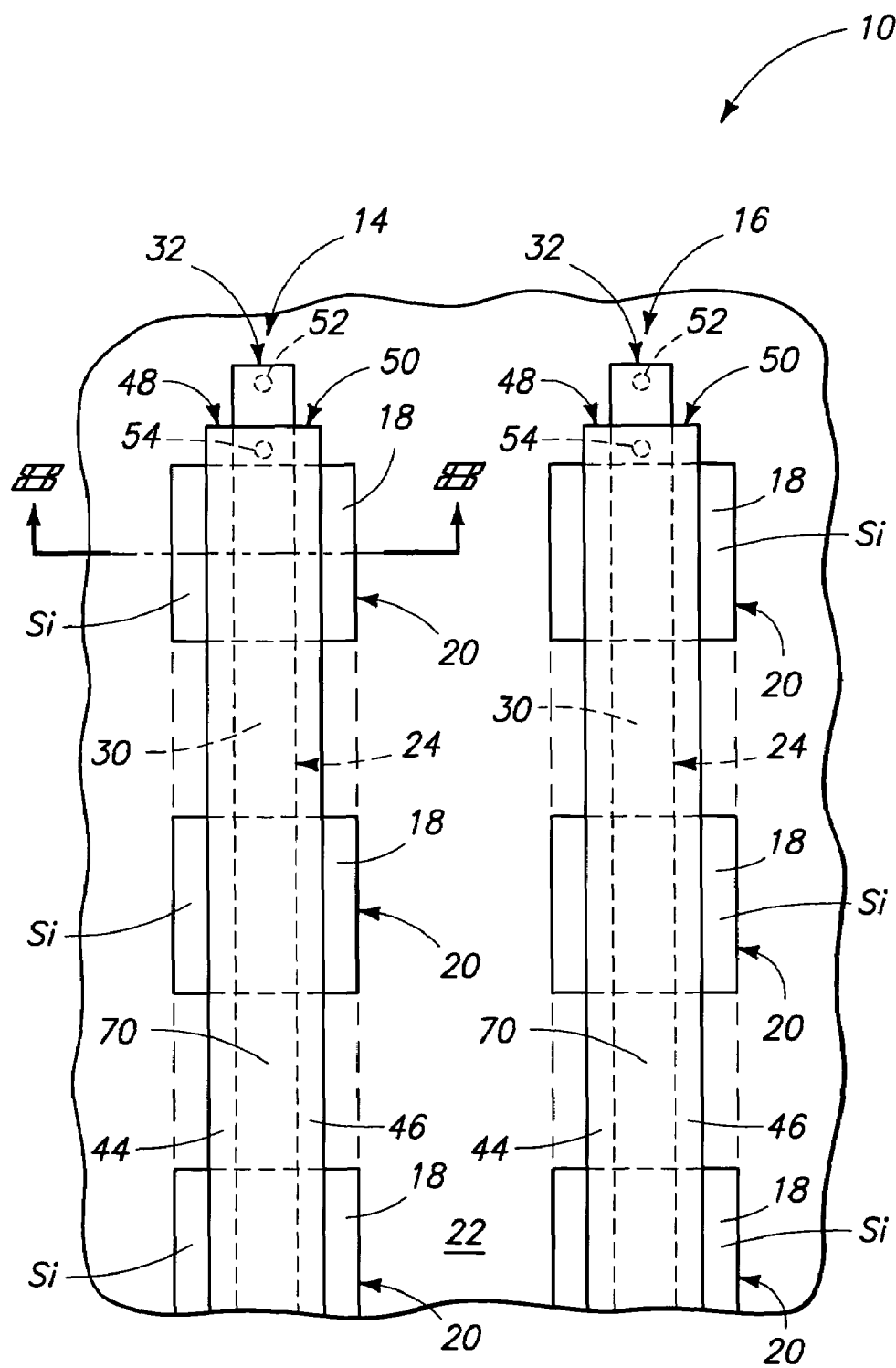
FIG. 10 is a diagrammatic top plan view of the FIGS. 8 and 9 substrate, with FIG. 8 being taken through line 8-8 in FIG. 10.

Referring to FIGS. 8-10, conductive layer 38 has been etched using masking block 40 (not shown) as a mask to form a pair of interconnected gate lines 44, 46 which are common to and extend over line 14 of spaced islands 20 along and laterally adjacent the opposing sides of word line 24, with pair of gate lines 44, 46 being received over respective floating body regions 26 of the respective spaced islands 20. Such provides but one exemplary preferred method of patterning a conductive layer 38 into a pair of gate lines which are common to and extend over the line of spaced islands along and laterally adjacent the opposing sides of the word line. For purposes of the continuing discussion, pair of gate lines 44, 46 can be considered as comprising respective ends 48, 50 proximate word line end 32. In one exemplary implementation, the patterning of layer 38 results in word line end 32 not being longitudinally co-located with either of gate line ends 48, 50, for example as shown. In one preferred implementation, the patterning of conductive layer 38 results in word line 24 extending longitudinally beyond respective ends 48, 50 of pair of gate lines 44, 46, for example as shown. Regardless, in one preferred implementation, the patterning forms pair of gate lines 44, 46 to be shorter in length than the length of word line 24.

Referring to FIGS. 9 and 10, a first conductive contact 52 is formed to word line 24, and a second conductive contact 54 is formed to pair of gate lines 44, 46. Accordingly different first and second conductive contacts are associated with the respective gate lines 44, 46 and word line 24 in a most preferred embodiment so that such can be separately controlled as recognized by people of skill in the art, and for example as described below. Contacts 52 and 54 are only diagrammatically indicated with dashed circles in FIGS. 9 and 10 as such would likely be formed to the exemplary depicted locations through subsequently deposited dielectric material (not shown for clarity in the drawings.) In one exemplary preferred implementation, first conductive contact 52 is formed to some portion of word line 24 extending longitudinally beyond respective ends 48, 50 of pair of gate lines 44, 46, for example as shown.

Figure 11:
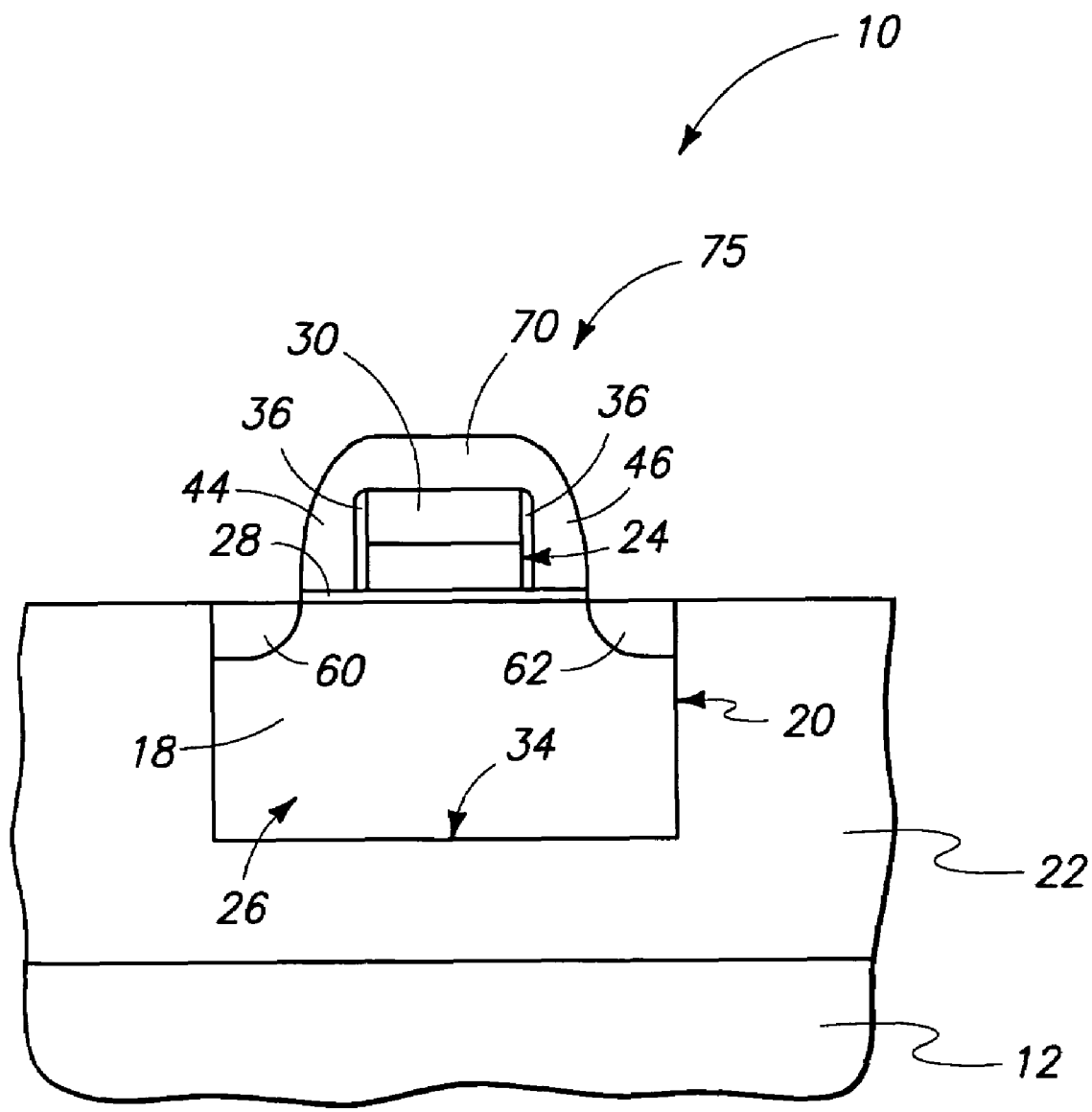
FIG. 11 is a view of the FIG. 8 substrate at a processing step subsequent to that shown by FIG. 8.

Referring to FIG. 11, respective pairs of spaced source/drain regions 60, 62 are formed within semiconductive material 18 of island 20 laterally outward of interconnected pair of gate lines 44, 46. Accordingly, typically and preferably, such source/drain regions are formed after the patterning of conductive layer 38. Regardless, FIG. 11 depicts an exemplary fabricated capacitorless one transistor DRAM cell 75.

In one aspect, the invention contemplates a capacitorless one transistor DRAM cell independent of the method of manufacture, and independent of whether a plurality of such DRAM cells are fabricated, although fabricating a plurality of such is preferred and would be typical. Such a DRAM cell comprises a pair of spaced source/drain regions received within semiconductive material. The above-described regions 60, 62 and formed within exemplary islands 20 of semiconductive material 18 are but exemplary constructions. An electrically floating body region is disposed between the source/drain regions within the semiconductive material. Further by way of example only, the exemplary cell is depicted as not being fully depleted, with semiconductive material directly beneath source/drain regions 60, 62 also comprising electrically floating body region/material.

A first gate is spaced apart from and capacitively coupled to the body region between the source/drain regions. That portion of word line 24 received over an individual island 20 is but one exemplary such first gate. A pair of opposing conductively interconnected second gates is spaced from and received laterally outward of the first gate. The second gates are spaced from and capacitively coupled to the body region laterally outward of the first gate and between the pair of source/drain regions. By way of example only, second gates 44, 46 constitute an exemplary pair of such second gates. In one depicted and preferred implementation, second gates 44, 46 are conductively interconnected to one another by conductive material (i.e., a conductive material region 70) extending elevationally over first gate 24 between pair of second gates 44, 46. Pair of second gates 44, 46 might be conductively interconnected by another manner, for example and by way of example only by a separate conductive layer formed over initially isolated second gates 44, 46. In such instance, such conductive layer might be the same or different from that of material or materials from which gates 44, 46 are made. Further of course, gates 44 and 46 do not need to be of the same composition, but are preferably.

In one preferred implementation, a capacitorless one transistor DRAM cell comprises a substrate comprising an island of semiconductive material. Insulative material is received laterally about and beneath the island and contacts semiconductive material of the island. A pair of spaced source/drain regions is received within the island semiconductive material. An electrically floating body region is disposed between the source/drain regions within the island semiconductive material. A first gate is spaced apart from and capacitively coupled to the island body region between the island's source/drain regions. A pair of conductive second gates is spaced from and received laterally outward of the first gates, with the second gates being spaced from and capacitively coupled to the body region laterally outward of the first gate and between the pair of source/drain regions. Such might be encompassed in any of the above-described methods and structures.

Figure 12:
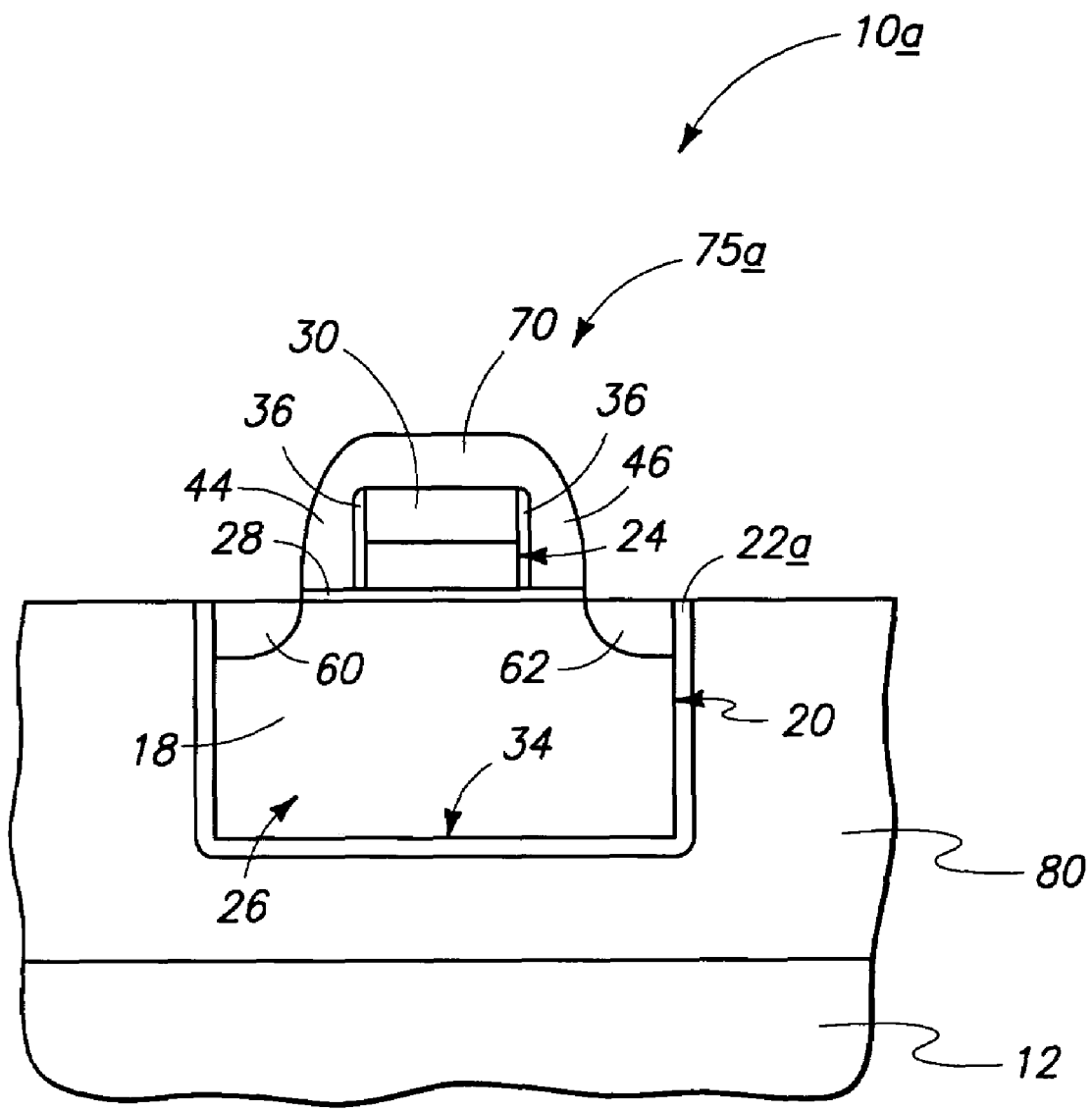
FIG. 12 is a diagrammatic sectional view of an alternate embodiment substrate to that of FIG. 11.

FIG. 12 depicts an exemplary additional implementation and embodiment alternate and corresponding to that of FIG. 11. Like numerals from the first-described embodiment have been utilized where appropriate, with differences being indicated with the suffix "a" or with different numerals. In FIG. 12, insulative material 22a is preferably received laterally about and beneath respective islands 20 and contacts semiconductive material 18 of such islands. Conductively doped semiconductive material 80 is received laterally about and beneath respective islands 20 outwardly of insulative material 22a. Exemplary preferred material 80 is conductively doped p-type or n-type polycrystalline silicon. Preferably, insulative material 22a has a thickness no greater than 200 Angstroms both beneath island 20 and intermediate the lateral sidewalls of island 20 and conductively doped semiconductive material 80. A more preferred such thickness range for material 22a is from 50 Angstroms to 150 Angstroms. The construction of FIG. 12 might, of course, be fabricated by any existing or yet-to-be developed methods.

People of skill in the art will appreciate and develop various operational voltages for writing, reading, refreshing, and/or holding data within the above-depicted exemplary DRAM cell, and in integrated circuitry comprising an array of such DRAM cells. By way of example only, the below chart depicts exemplary operating voltages, where $V_i$ is the first gate voltage, $V_{cs}$ (conductive spacers) are voltages for the pair of second gates, $V_t$ is the threshold voltage, $V_S$ is the source voltage, and $V_D$ is the drain voltage. Further by way of example only where conductive surrounding semiconductive material 80 in the FIG. 12 embodiment is utilized, such would preferably be maintained constant at some suitable exemplary fixed voltage of −3 V to −10 V. A preferred, non-limiting, reason for utilizing surround conductively doped semiconductive material 80 is to establish and maintain the same potential of both sides of preferred poly of the transistor so that charge collects at the walls of the structure by the dielectric capacitance.

| Exemplary Operating Voltages | | | | |
|---|---|---|---|---|
| $V_i$ | $V_{cs}$ | $V_t$ | $V_D$ | $V_S$ |
| Write −3 V to −10 V | −2.5 V | High | 1.8 V/0 V | Float/0 V |
| Hold Data −3 V to −10 V | 0 V | High | Float/Float | Float/0 V |
| Read 2.5 V | 2.5 V | 0.5 V | 0.1 V/0.1 V | 0 V/0 V |
| Re-Write −3 V to −10 V | −2.5 V | High | 1.8 V/0 V | Float/0 V |
| Hold Data −3 V to −10 V | 0 V | High | Float/Float | Float/0 V |

Exemplary techniques and construction for the operation of capacitorless one transistor DRAM cells are disclosed, by way of example, in U.S. Pat. No. 6,969,662; U.S. patent application Ser. Nos. 2005/0017240 and 2005/0063224; Kuo et al., "A Capacitorless Double-Gate DRAM Gate Cell Design For High Density Applications", IEDM, IEEE 2002, pp. 843-846 and Yoshida et al., "A Capacitorless 1 T-DRAM Technology Using Gate-Induced Drain-Leakage (GIDL) Current For Low-Power And High-Speed Embedded Memory", IEEE Transactions on Electron Devices, Vol. 53, No. 4, April 2006, pp. 692-697. The disclosures of U.S. Pat. Nos. 5,714,786; 6,005,273; 6,090,693; and 7,005,710 are herein incorporated by reference.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A capacitorless one transistor DRAM cell, comprising:
   a pair of spaced source/drain regions received within semiconductive material;
   an electrically floating body region disposed between the source/drain regions within the semiconductive material; the floating body region having a base, an insulative layer being received against the base, conductively doped semiconductive material being received against the insulative layer beneath the base;
   a first gate spaced apart from and capacitively coupled to the body region between the source/drain regions; and
   a pair of opposing conductively interconnected second gates spaced and electrically isolated from the first gate, and received laterally outward of the first gate, the second gates being spaced from and capacitively coupled to the body region laterally outward of the first gate and capacitively coupled to the body region between the pair of source/drain regions.

2. The DRAM cell of claim 1 wherein the pair of second gates is conductively interconnected by conductive material extending elevationally over the first gate between the pair of second gates.

3. The DRAM cell of claim 1 wherein the first gate is separated from the second gates by at least two insulative materials.

4. The DRAM cell of claim 1 wherein the floating body region has a base, an insulative layer being received against the base, the insulative layer having a thickness of from 500 Angstroms to 3,000 Angstroms.

5. The DRAM cell of claim 1 wherein the insulative layer has a thickness no greater than 200 Angstroms intermediate the base and the conductively doped semiconductive material.

6. A capacitorless one transistor DRAM cell, comprising:
a substrate comprising an island of semiconductive material;
insulative material received around and underneath the island and contacting semiconductive material of the island;
a pair of spaced source/drain regions received within the island semiconductive material;
an electrically floating body region disposed within the island semiconductive material;
a first gate spaced apart from and capacitively coupled to the island floating body region at least partially between the island source/drain regions; and
a pair of conductive second gates spaced from and received laterally outward of the first gate, the second gates being spaced from and capacitively coupled to the island floating body region laterally outward of the first gate and at least partially between the pair of source/drain regions.

7. The DRAM cell of claim 6 comprising conductively doped semiconductive material received around and underneath the island outwardly of the insulative material.

8. The DRAM cell of claim 7 wherein the insulative material has a thickness no greater than 200 Angstroms beneath the island.

9. The DRAM cell of claim 7 wherein the insulative material has a thickness no greater than 200 Angstroms intermediate lateral sidewalls of the island and the conductively doped semiconductive material.

10. The DRAM cell of claim 7 wherein the insulative material has a thickness no greater than 200 Angstroms beneath the island and intermediate lateral sidewalls of the island and the conductively doped semiconductive material.

11. The DRAM cell of claim 7 wherein the insulative material has a thickness from 50 Angstroms to 150 Angstroms beneath the island.

12. The DRAM cell of claim 7 wherein the insulative material has a thickness from 50 Angstroms to 150 Angstroms intermediate lateral sidewalls of the island and the conductively doped semiconductive material.

13. Integrated circuitry comprising an array of capacitorless one transistor DRAM cells, comprising:
a series of spaced islands of semiconductive material received within a substrate; and
individual capacitorless one transistor DRAM cells being received relative to individual of the spaced islands, the individual cells each comprising:
a pair of source/drain regions received within the semiconductive material of the respective island;
an electrically floating body region disposed within the semiconductive material of the respective island;
a first gate comprised of a word line which is common to and extends over the series of spaced islands at least partially between the respective pairs of source/drain regions, the word line having lateral sides and being spaced apart from and capacitively coupled to the respective body regions of the respective islands; and
a pair of opposing conductively interconnected second gates spaced from the first gate and received laterally outward of the first gate, the second gates being spaced from and capacitively coupled to the respective body regions laterally outward of the respective first gates and at least partially between the respective pairs of source/drain regions of the respective islands, the pairs of opposing interconnected second gates comprising a conductive line which is common to the series of spaced islands and extends above and to the lateral sides of the word line.

14. The integrated circuitry of claim 13 comprising a first conductive contact connected to the word line and a different second conductive contact connected to the conductive line.

15. The integrated circuitry of claim 13 wherein the word line is longer in length than the conductive line.

16. The integrated circuitry of claim 13 wherein the conductive line has an end and the word line has an end proximate the conductive line end, said word line end and said conductive line end not being longitudinally co-located.

17. The integrated circuitry of claim 16 wherein the word line is longer in length than the conductive line.

18. The integrated circuitry of claim 16 wherein the word line end is received longitudinally outward of the conductive line end.

19. The integrated circuitry of claim 18 wherein the word line is longer in length than the conductive line.

20. The integrated circuitry of claim 13 comprising insulative material received around and underneath the respective islands and contacting semiconductive material of the respective islands; and
conductively doped semiconductive material received around and underneath the island outwardly of the insulative material.

21. The integrated circuitry of claim 20 wherein the insulative material has a thickness no greater than 200 Angstroms beneath the respective islands and intermediate lateral sidewalls of the respective islands and the conductively doped semiconductive material.

22. A method of forming a series of capacitorless one transistor DRAM cells, comprising:
forming a series of spaced islands of semiconductive material relative to a substrate;
forming a word line which is common to and extends over the series of spaced islands, the word line being formed over an electrically floating body region of the respective spaced islands;
forming a conductive layer over and spaced from the word line;
patterning the conductive layer into a pair of gate lines which are common to and extend at least partially over the series of spaced islands on opposite sides of the word line, the pair of gates lines being received over respective floating body regions of the respective spaced islands, the patterning forming the pair of gate lines to be shorter in length than length of the word line; and
forming respective pairs of spaced source/drain regions within the semiconductive material of the respective islands, the pairs of spaced source/drain regions including portions formed laterally outward of the pair of gate lines.

23. The method of claim 22 wherein the source/drain regions are formed after said patterning.

24. The method of claim 22 comprising forming a first conductive contact to the word line and a second conductive contact to the pair of gate lines.

25. The method of claim 22 wherein the word line is formed to have an end and the patterning forms a respective end of the pair of gate lines that is proximate the word line end, the patterning resulting in the word line end not being longitudinally co-located with either of said gate line ends.

26. The method of claim 22 wherein the patterning comprises:
forming a masking block over the conductive layer and the word line, the masking block having spaced opposing lateral edges;
after forming the masking block, heating the masking block effective to move the opposing lateral edges laterally outward further away from one another over the conductive layer; and
after the heating, etching the conductive layer using the masking block as a mask to form said pair of gate lines.

27. The method of claim 26 wherein the word line is formed to have an end and the patterning forms a respective end of the pair of gate lines that is proximate the word line end, the patterning resulting in the word line end not being longitudinally co-located with either of said gate line ends.

28. The method of claim 22 comprising:
providing insulative material around and underneath the respective islands and contacting semiconductive material of the respective islands; and
providing conductively doped semiconductive material around and underneath the island outwardly of the insulative material.

29. A method of forming a series of capacitorless one transistor DRAM cells, comprising:
forming a series of spaced islands of semiconductive material relative to a substrate;
forming a word line which is common to and extends over the series of spaced islands, the word line being formed over an electrically floating body region of the respective spaced islands and comprising an end;
forming a conductive layer over and spaced from the word line;
patterning the conductive layer into a pair of gate lines which are common to and extend at least partially over the series of spaced islands on opposite sides of the word line, the pair of gates lines being received over respective floating body regions of the respective spaced islands, the patterning forming respective ends of the pair of gate lines proximate the word line end, the patterning resulting in the word line extending longitudinally beyond the respective ends of the pair of gate lines; and
forming respective pairs of spaced source/drain regions within the semiconductive material of the respective islands, the pairs of spaced source/drain regions including portions formed laterally outward of the pair of gate lines.

30. The method of claim 29 wherein the patterning comprises:
forming a masking block over the conductive layer and the word line, the masking block having spaced opposing lateral edges;
after forming the masking block, heating the masking block effective to move the opposing lateral edges laterally outward further away from one another over the conductive layer; and
after the heating, etching the conductive layer using the masking block as a mask to form said pair of gate lines.

31. The method of claim 29 comprising forming a first conductive contact to the word line and a second conductive contact to the pair of gate lines.

32. The method of claim 31 comprising forming the first conductive contact to some portion of the word line extending longitudinally beyond the respective ends of the pair of gate lines.

33. The method of claim 29 comprising:
providing insulative material laterally around and underneath the respective islands and contacting semiconductive material of the respective islands; and
providing conductively doped semiconductive material around and underneath the island outwardly of the insulative material.

34. A method of forming a series of capacitorless one transistor DRAM cells, comprising:
forming a series of spaced islands of semiconductive material relative to a substrate;
forming a word line which is common to and extends over the line of spaced islands, the word line being formed over an electrically floating body region of the respective spaced islands;
forming a conductive layer over and spaced from the word line;
forming a masking block over the conductive layer and the word line, the masking block having spaced opposing lateral edges;
after forming the masking block, heating the masking block effective to move the opposing lateral edges laterally outward further away from one another over the conductive layer;
after the heating, etching the conductive layer using the masking block as a mask to form a pair of interconnected gate lines which are common to and extend over the series of spaced islands on opposite sides of the word line, the pair of gates lines being received over respective floating body regions of the respective spaced islands; and
forming respective pairs of spaced source/drain regions within the semiconductive material of the respective islands, the pairs of spaced source/drain regions including portions formed laterally outward of the interconnected pair of gate lines.

35. The method of claim 34 comprising forming the masking block to comprise photoresist.

36. The method of claim 34 wherein the source/drain regions are formed after said patterning.

37. The method of claim 34 comprising forming a first conductive contact to the word line and a second conductive contact to the pair of gate lines.

38. The method of claim 37 comprising forming the first conductive contact to some portion of the word line extending longitudinally beyond the respective ends of the pair of gate lines.

\* \* \* \* \*

UNITED STATES PATENT AND TRADEMARK OFFICE
CERTIFICATE OF CORRECTION

PATENT NO. : 7,602,001 B2
APPLICATION NO. : 11/488384
DATED : October 13, 2009
INVENTOR(S) : Fernando Gonzalez It is certified that error appears in the above-identified patent and that said Letters Patent is hereby corrected as shown below:

On the title page, item (56), in column 1, line 5, delete "METHOD" and insert -- METHODS --, therefor.

In column 1, line 5, delete "METHOD" and insert -- METHODS --, therefor.

Signed and Sealed this

Twenty-second Day of December, 2009

David J. Kappos
*Director of the United States Patent and Trademark Office*

UNITED STATES PATENT AND TRADEMARK OFFICE
CERTIFICATE OF CORRECTION

PATENT NO. : 7,602,001 B2  Page 1 of 1
APPLICATION NO. : 11/488384
DATED : October 13, 2009
INVENTOR(S) : Fernando Gonzalez It is certified that error appears in the above-identified patent and that said Letters Patent is hereby corrected as shown below:

On the title page, item (54), in column 1, line 5, delete "METHOD" and insert -- METHODS --, therefor.

In column 1, line 5, delete "METHOD" and insert -- METHODS --, therefor.

This certificate supersedes the Certificate of Correction issued December 22, 2009.

Signed and Sealed this

Twelfth Day of January, 2010

David J. Kappos
*Director of the United States Patent and Trademark Office*